(12) United States Patent
Wong et al.

(10) Patent No.: US 6,980,000 B2
(45) Date of Patent: Dec. 27, 2005

(54) COILS FOR HIGH FREQUENCY MRI

(75) Inventors: Wai Ha Wong, San Jose, CA (US); Jimmy Leung, Fremont, CA (US); Alexander Funk, Mountain View, CA (US); Knut Mehr, San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/425,780

(22) Filed: Apr. 29, 2003

(65) Prior Publication Data

US 2004/0217761 A1  Nov. 4, 2004

(51) Int. Cl.⁷ .............................................. G01V 3/00
(52) U.S. Cl. ...................................................... 324/318
(58) Field of Search ............................. 324/300, 307, 324/309, 318, 322; 600/410, 422; 333/219, 333/222

(56) References Cited

U.S. PATENT DOCUMENTS

| | | | |
|---|---|---|---|
| 4,083,006 A | | 4/1978 | Yokoshima |
| 4,621,237 A | | 11/1986 | Timms |
| 4,691,164 A | * | 9/1987 | Haragashira ................. 324/322 |
| 4,788,503 A | * | 11/1988 | Van Heelsbergen ......... 324/322 |
| 4,816,766 A | | 3/1989 | Zabel et al. |
| 4,835,472 A | | 5/1989 | Zabel et al. |
| 4,836,472 A | * | 6/1989 | Sutter et al. ............. 244/114 R |
| 4,922,204 A | * | 5/1990 | Duerr et al. ................. 324/322 |
| 4,945,321 A | * | 7/1990 | Oppelt et al. ............... 333/119 |
| 5,055,792 A | | 10/1991 | Keren |
| 5,256,972 A | * | 10/1993 | Keren et al. ................. 324/318 |
| 5,317,266 A | * | 5/1994 | Meissner ..................... 324/318 |
| 5,349,298 A | * | 9/1994 | Nakabayashi ............... 324/322 |
| 5,386,191 A | * | 1/1995 | McCarten et al. .......... 324/318 |
| 5,450,011 A | | 9/1995 | Boeijen et al. |
| 5,585,721 A | * | 12/1996 | Datsikas ...................... 324/318 |
| 5,742,165 A | * | 4/1998 | Snelten et al. .............. 324/318 |
| 5,898,306 A | | 4/1999 | Liu et al. |
| 5,998,999 A | * | 12/1999 | Richard et al. ............. 324/318 |
| 6,278,277 B1 | * | 8/2001 | Zeiger ......................... 324/322 |
| 6,307,371 B1 | * | 10/2001 | Zeiger ......................... 324/318 |
| 6,313,631 B1 | * | 11/2001 | Fiat et al. .................... 324/318 |
| 6,414,485 B1 | * | 7/2002 | Kato et al. .................. 324/307 |
| 6,580,274 B2 | * | 6/2003 | Sato ............................ 324/318 |
| 6,636,040 B1 | * | 10/2003 | Eydelman ................... 324/318 |
| 6,727,698 B1 | * | 4/2004 | Eydelman ................... 324/318 |
| 2002/0033696 A1 | | 3/2002 | Engelke |
| 2002/0079996 A1 | | 6/2002 | Zhang et al. |
| 2002/0180439 A1 | | 12/2002 | Lee |

OTHER PUBLICATIONS

Japanese Abstract entitled "Shield Type Loop Gas Resonator", P-963, Nov. 21, 1989, vol. 13/No. 520.

Article by Doty et al. entitled A Multinuclear Double-Tuned Probe for Applications with Solids or Liquids Utilizing Lumped Tuning Elements, published by Journal of Magnetic Resonance, vol. 43, pp. 399-416 (1981).

(Continued)

Primary Examiner—Louis Arana
Assistant Examiner—Dixomara Vargas
(74) Attorney, Agent, or Firm—Bella Fishman; Edward H. Berkowitz

(57) ABSTRACT

NMR coils are formed from transmission line comprising a tuned LC circuit determined substantially from the distributed capacitance and inductance of the transmission line operated in common mode. Introduction of gaps staggered between opposite conductors of 2-conductor transmission line contribute a desired distributed capacitance with reduced effective inductance to sustain resonant behavior at higher frequency than achievable with conventionally tuned coils and with relaxation of dimensional constraints as the resonant half wavelength approaches coil dimensions.

5 Claims, 17 Drawing Sheets

OTHER PUBLICATIONS

Article by Cook et al. entitled "A Large-Inductance, High-Frequency, High-Q, Series-Tuned Coil for NMR", published by Journal of Magnetic Resonance, vol. 49, pp. 346-349 (1982).

Article by Gonord, P, et al. entitled "Multigap Parallel-Plate Bracelet Resonator Frequency Determination and Applications", published in Review of Scientific Instruments, 65, (11) Nov. 1994.

Article by Gonord, P, et al. entitled "Twin-horseshoe Resonator-An Investigation", published in Review of Scientific Instruments, 65, (2), Feb. 1994.

* cited by examiner

COILS FOR HIGH FREQUENCY MRI

FIELD OF THE INVENTION

The invention is in the field of spatially sensitive NMR instrumentation and relates to resonant coils of novel construction and particularly to surface coils for localized magnetic resonance studies.

BACKGROUND OF THE INVENTION

NMR investigation of selected interior regions of an object have long employed a surface coil disposed on the exterior surface of the object proximate a region of interest to localize an RF resonance signal incident to magnetic resonance excitation. A surface coil has the attributes of an antenna and is desirably of no significantly greater extent than the region of interest. The surface coil is often analogized to a loop antenna in combination with a tunable resonant circuit. The ideal surface coil provides strong coupling to a delimited region of the object with enhanced sensitivity and minimal radiation losses.

In typical imaging instrumentation and usage, excitation of nuclear resonance is effected with a volume coil providing excitation of resonance over a volume region of the object under study. Local excitation may be obtained with a surface coil, although it is rather more common practice to employ the surface coil in the receive channel. This is by no means a limitation in respect to the present invention.

Certain surface coils for NMR use have been inspired by the use of ladder circuits to produce particularly effective coupling between the nuclear spins of the object and an RF source or sink. See U.S. Pat. Nos. 5,898,306; 6,169,401. Ladder circuits are the usual analytic model for transmission lines, which are often modeled as LC ladder circuits in consideration of the inductance of two spaced apart conductors furnishing distributed inductance and the distributed capacitance therebetween. The ladder circuit is conveniently analyzed as a four terminal network/device. This network exhibits inductive and capacitive reactances distributed over the network. The ladder network is commonly periodic in a basic mesh, or loop: that is, there is discerned an axis of periodicity over which the elementary mesh units repeat, forming the ladder. Ladder networks have been employed in prior art but it will be apparent that the construction of any ladder network/surface coil requires careful selection of discrete circuit components to preserve the design integrity of the circuit as well as laborious manufacture of the coil from a variety of components. As inductance and capacitance become continuously distributed, the network acquires the functional aspect of a transmission line. In conventional usage, an RF current is applied to the terminals at one (axial) end of the transmission line/ladder network propagates along the axis of periodicity to a specified load or short circuit connected to the other (axial) end terminals. The transmission line/ladder network acquires the character of a tuned circuit when the axial length of the line/network is $n\lambda/2$ where n is an integer. In an example of prior art of this form, surface coils have been implemented from coaxial transmission line components in prior art. In one such arrangement a loop is formed in coaxial cable and the free end of the inner conductor is shorted to the free end of outer conductor, this shorted end being connected to the standing portion of the outer conductor to form the loop. Opposite this connection point, or vertex (e.g., 180° therefrom) of the loop, the outer conductor is interrupted to form a small gap. Thus, outer conductors on both sides of the gap are electrically joined opposite the gap, and the free end of the inner conductor is similarly shorted to the outer conductor at the vertex of the loop. The remaining coaxial conductor length leading away from the loop communicates with an amplifier. In this prior art, the full line length from the amplifier around the loop to the vertex is $n\lambda/2$. See U.S. Pat. No. 4,816,766. The dimensional constraint on surface coils is undesirable.

SUMMARY OF THE INVENTION

The present invention exploits serially distributed capacitance inherent in coaxial, stripline, twisted pair conductors or other form of transmission line to achieve a tuned circuit in the form of an NMR coil, and particularly a surface coil characterized by dimensions small compared to half wavelengths of the RF energy resonant in the tuned circuit. Transmission line structures are characterized as 4 terminal LC circuits comprising two spaced apart conductors contributing (inherently) distributed inductance over the length of the line and distributed capacitance therebetween. One readily identifies the terminals at opposite ends of each conductor as directly coupled and the two spaced apart conductors are principally capacitively coupled. In the present invention, the typical transmission line arrangement is not employed. Instead, a common mode RF current is supported by the respective RF active terminals at opposite (axial) ends of the transmission line corresponding to the respective conductors and thus are not directly coupled. "Active" terminals refers to connection to an RF active device, whether a source or receiver. (Floating terminals will be so referenced as such whether or not physically extant and the ladder circuit/transmission line remains a 4 terminal device.) The functional common mode of the transmission line is selected to form a tuned circuit for resonant coupling to real objects through the medium of the RF magnetic field with substantial or complete exclusion of electric field coupling to the object under study. Suppression of E field coupling is especially desirable in NMR studies to reduce losses. For convenience reference will frequently be made to transmission line as the vehicle for realizing distributed capacitance for support of common mode currents and common mode transmission line is to be understood as a transmission line structure supporting a common mode current.

Various arrangements presented herein typically feature a loop of transmission line formed of spaced inductive conductors mutually coupled (principally) through the distributed capacitance therebetween and forming an LC circuit resonant at a selected nominal frequency. In one form, each inductive conductor has a driven (more generally, "active") end (terminal) and a floating end (terminal). In this work, the transmission line will continue to be regarded as a four terminal LC ladder network comprising two generally spaced apart inductive members exhibiting a substantially uniform distributed capacitance therebetween, as illustrated schematically in FIG. 2D. The four terminals will be consistently identified as directly coupled terminals A and C to represent the active and floating terminals of a first inductor and directly coupled terminals B and D as terminals of the second inductor. Whether terminal B is active or floating may vary in the different embodiments, however, for consistent notation, B will be regarded as physically proximate to active terminal A. With these conventions the transmission line 50 is conveniently represented by a rectangle symbol and diagonally opposed (common mode) terminals (A and D, or B and C) are recognized as presenting capacitive coupling while axially aligned terminals (A and C, or B and D) are direct coupled. Effects determined by finite resistance and mutual inductance of the conducting members need not be specifically treated in the scope of this work for the understanding of the invention.

The active end of one conductor is therefore spatially proximate the floating end of the other conductor. The two active terminals in the present invention define a common mode capacitively coupled path for an RF current supporting an RF magnetic field. The transmission line surface coil forms a tuned LC circuit through its distributed capacitance and inductance. The transmission line is formed into a loop of desired geometry and oriented with the RF magnetic field transverse to a polarizing magnetic field for exciting/detecting nuclear magnetic resonance. An external variable capacitor connected across the terminals provides a vernier to more precisely adjust the resonant frequency. Impedance matching to the RF source/receiver is commonly obtained with an appropriate series capacitor between the surface coil and the RF source/receiver. The invention does not employ the explicit "transmission" properties of a transmission line or equivalent circuit, although the structure is conveniently a transmission line and will be so referenced herein.

The introduction of one (or more) gaps in a conductive member of a transmission line is the analytic equivalent of two (or more) serially communicating transmission lines. One practical functional effect of the gap is to reduce the effective inductance of the transmission line relative to the distributed capacitance, thus facilitating relatively higher resonant frequency resonant response for a circuit comprising the transmission line in common mode. Embodiments of the transmission line surface coil of this invention, incorporating increasing multiple gaps (in opposite conductors, arranged in staggered fashion) are found to exhibit increasingly narrow band response.

Multiple resonant LC circuits are also effectuated with a transmission line resonant circuit. Distinct RF current paths through the transmission line with corresponding frequency dependent impedances are realized in one embodiment by incorporating a pair of direct coupled terminals of the 4 terminal transmission line in one resonant circuit and a pair of common mode terminals in another resonant circuit. Another embodiment defines the two circuits to include the separate pairs of common mode terminals in respective resonant circuits.

BRIEF DESCRIPTION OF THE DRAWINGS

FIG. 3b is the functional analytic circuit for the surface coil of FIG. 3a

FIG. 4b is another physical realization of FIG. 4a

FIG. 6b is a functional analytic circuit for the surface coil of FIG. 6a.

FIG. 6c is another embodiment of FIG. 6a.

DETAILED DESCRIPTION OF THE INVENTION

Figure 1:
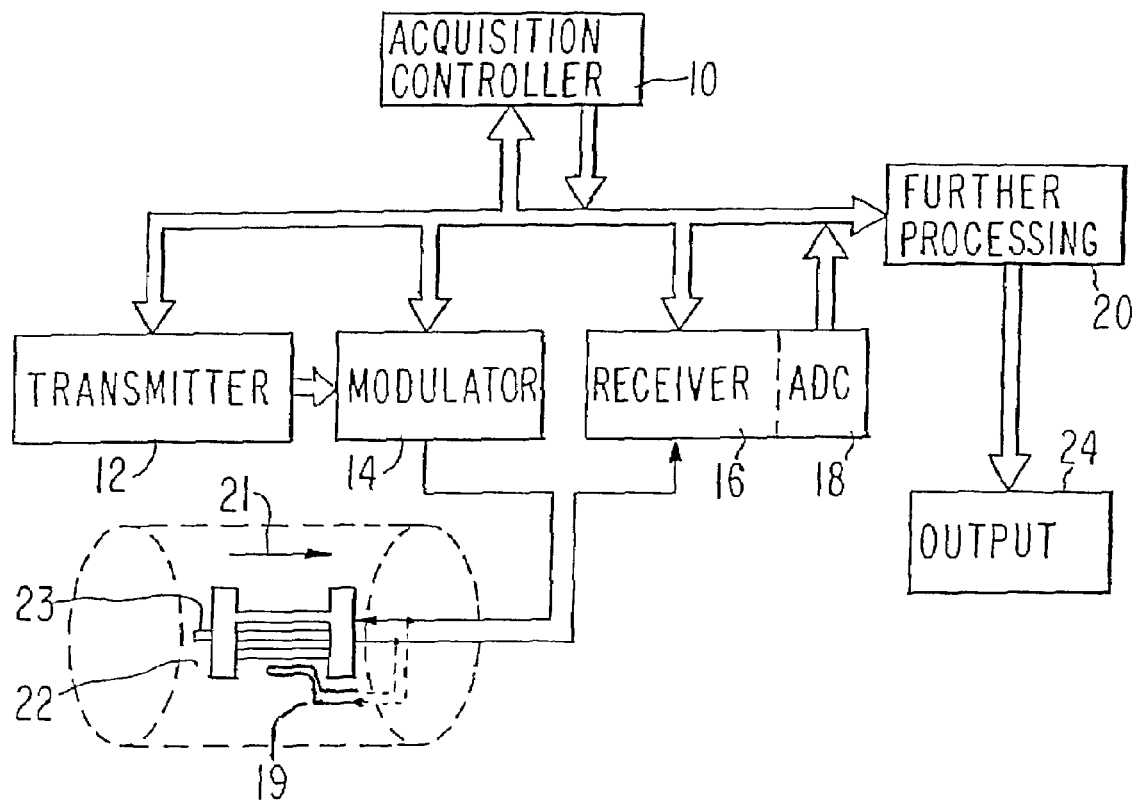
FIG. 1 shows a schematicized context of the invention.

FIG. 1 represents the context of the invention represented by a schematicised general NMR instrument. An acquisition/control processor 10 communicates with an RF source 12, modulator 14 and RF receiver 16, including analog-to-digital convertor 18 and a further digital processor 20. The modulated RF power ordinarily comprises a sequence of RF pulses of specified frequency content, duration and phase and irradiates an object/sample 23 in a magnetic field 21 through (volume) excitation coil 22. Other magnetic field components or gradients may be superimposed upon magnetic field 21 in predetermined synchronization with the RF modulation. Response of the sample/object is intercepted by the same coil 22 or alternatively, coil 19 communicating with receiver 16. The coil(s) 22 and/or 19 may have a volume or surface geometry as may be appropriate to the particular investigation. The response typically takes the form of a transient time domain waveform or free induction decay. This transient waveform is sampled at regular intervals and the samples are digitized in ADC 18. The digitized time domain waveform is then subject to further processing in processor 20. The nature of such processing may include averaging the time domain waveform over a number of similar such waveforms and transformation of the averaged time domain waveform to the frequency domain yields a spherical distribution function directed to output device 24. For imaging modalities, the output device 24 displays spatially selective spectra, or transforms the acquired spectral distributions to images representative of the density distribution of excited nuclear spins. This procedure may be repeated with variation of a selected parameter such that the transformation(s) from the data set may take on any of a number of identities for display or further analysis.

Figure 2A:
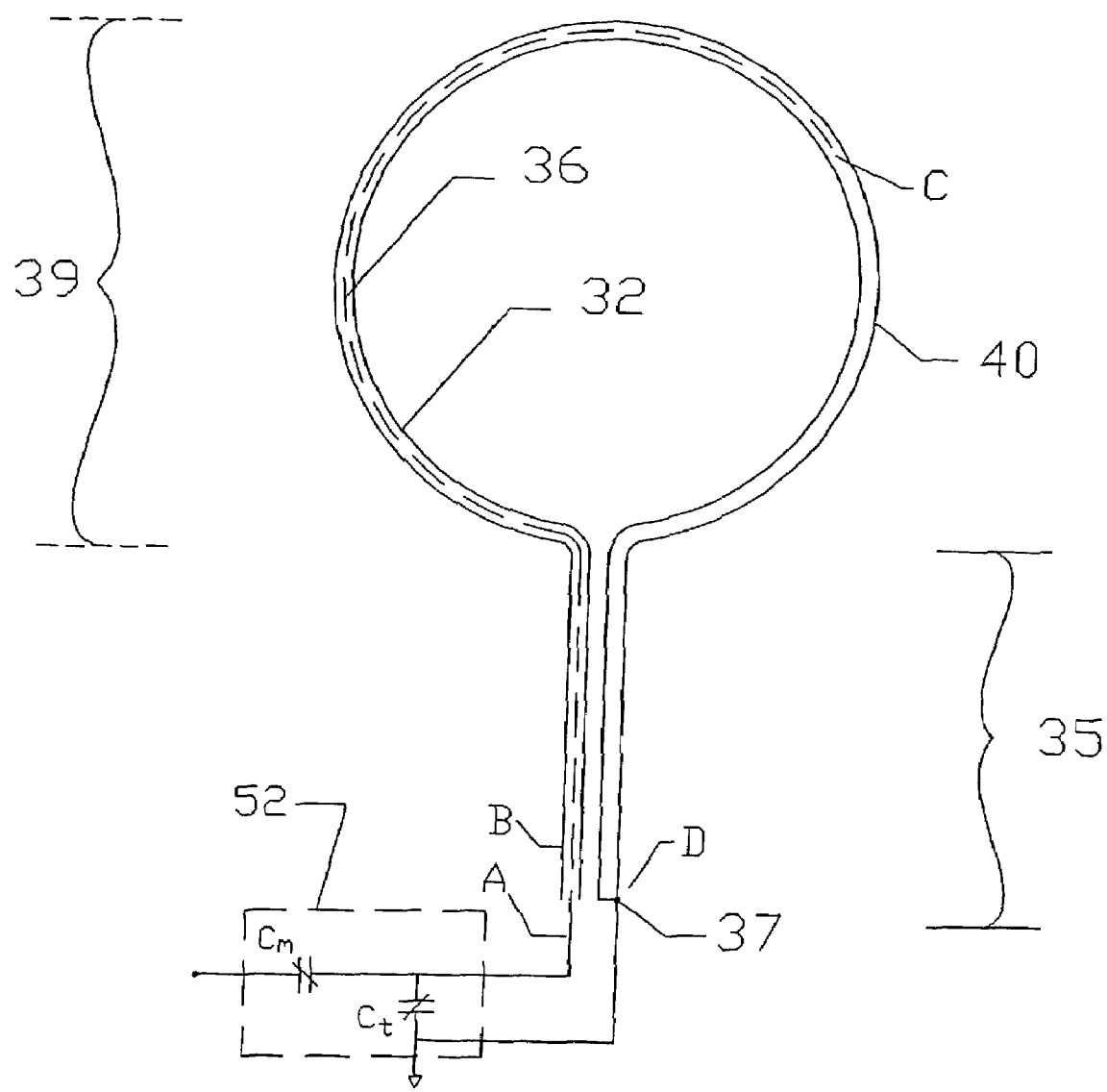
FIG. 2a is one embodiment of the invention realized in a coaxial conductor.
Figure 2E:
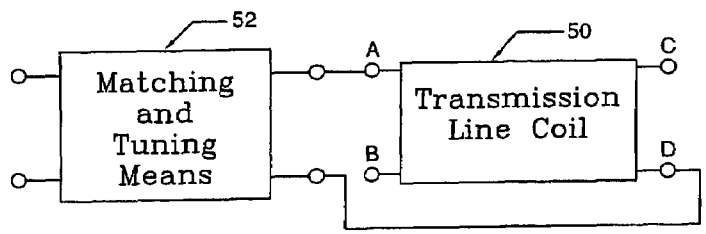
FIG. 2e is the symbolic equivalent of the embodiments of FIGS. 2a–c.

The exposition of the invention is best initiated with a consideration of the simplest single resonant embodiment, which may be obtained in different constructions representing different choices of transmission lines. (Similar components will bear common labeling in the several figures). FIG. 2a shows a single loop surface coil for resonant coupling to the nuclear spins of the object under study. A coaxial conductor 40 is formed into a loop portion 39 driven through stem portion 35. An inner conductor 36 of the coax is driven at one end A and has a floating end C. The outer conductor 32 has a floating end B proximate the active end D of the inner conductor 30. The outer conductor 32 is activated/driven from its other end 37. The inner and outer conductors need not be of equal length. The inner conductor is of such length that the integrated distributed capacitance of the coaxial conductor and the inductances of inner and outer conductor is such to produce an effective LC circuit resonant at a desired center frequency. A tuning capacitor $c_t$ is connected across the driven terminals to vary the resonant behavior over a desired range. The value of the distributed capacitance, $c_d$ and tuning capacitance $c_t$ are chosen such that $c_d \geq c_t$, that is, $c_t$ is a significant increment to $c_d + c_t$ over the range of the tuning capacitor $c_t$. In general, ct and a series capacitance cm are examples of a tuning and matching network for adjusting the resonant properties of the tuned surface coil and for matching the impedance thereof to an RF source or receiver. While the length of the inner conductor 36 is chosen (for the characteristics of the coax) to provide a desired value of distributed capacitance $c_d$, the radius r, or the general periphery of the loop portion of the surface coil is somewhat selectable, preferably to establish the RF field distribution of the coil. The stem 35 permits the loop portion 39 to be disposed relatively remote from tuning and matching components.

Figure 2B:
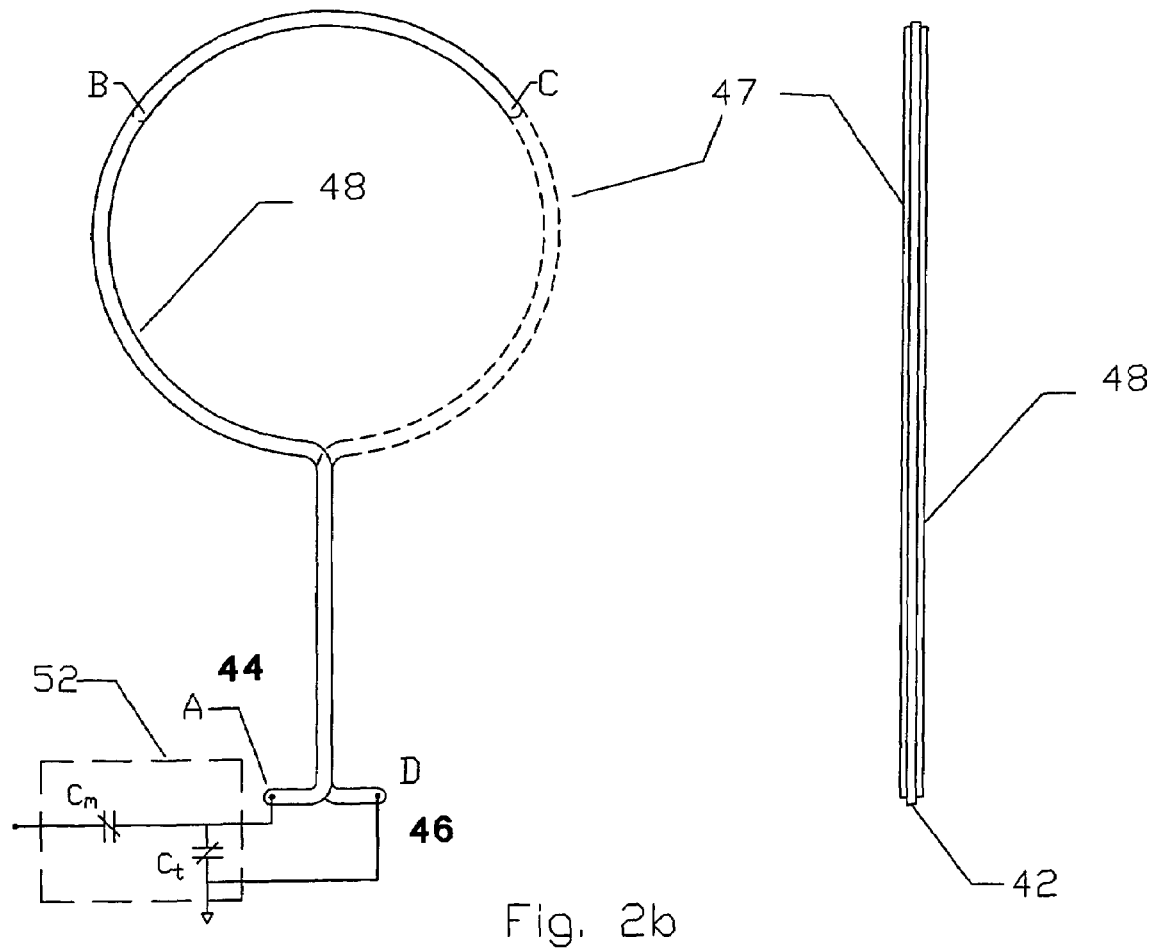
FIG. 2b is the same embodiment as FIG. 2a, realized in a stripline.

Turning now to FIG. 2b, there is shown a stripline embodiment corollary to the coaxial surface coil of FIG. 2a. On opposite facing sides of a dielectric substrate 42, first and second conductive traces 47 and 48 are developed in substantial alignment. Taken together in projection, the two conductors describe stem and loop portions subtending approximately $2\pi$ about an interior point of the surface defined by the loop. The two conductors share a region of overlap, but need not be of equal length. The overlap region provides for specified capacitive coupling between conductive traces 47 and 48. A suitably chosen capacitor $c_m$ provides impedance matching to an external RF device and variable capacitor $c_t$ across the respective active terminals 44 and 46 provide necessary tuning adjustment to secure the desired RF resonance condition. Tuning and matching functions may be fulfilled by a variety of networks as may be determined by the desired resonant properties of the tuned coil. For convenience, the tune and match network 52 is symbolized in the general sense.

It should be remarked that FIGS. 2a and 2b are shown in a general arrangement wherein the shape and dimension of the surface coil is independently specified. Absent such independent specification of geometry, the loop portion of the surface coil would ordinarily distribute the capacitance between conductors over the substantially $2\pi$ radian included angle of the loop. It is apparent that the different modalities of transmission line offer corresponding convenience in selecting the value of the distributed capacitance through choice of dielectric constant, geometric properties, etc.

Figure 2C:
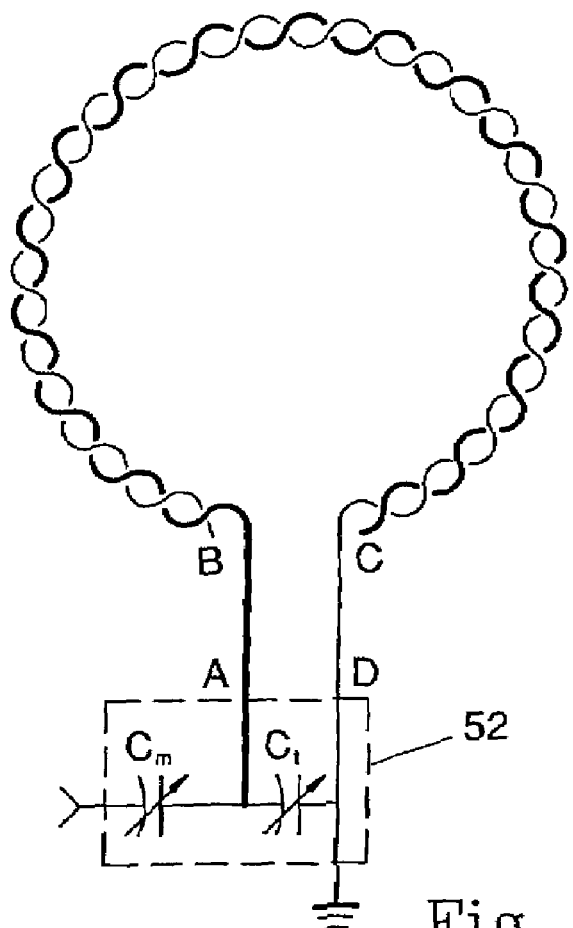
FIG. 2c is the same embodiment as FIG. 2a, realized in a twisted pair.
Figure 2D:
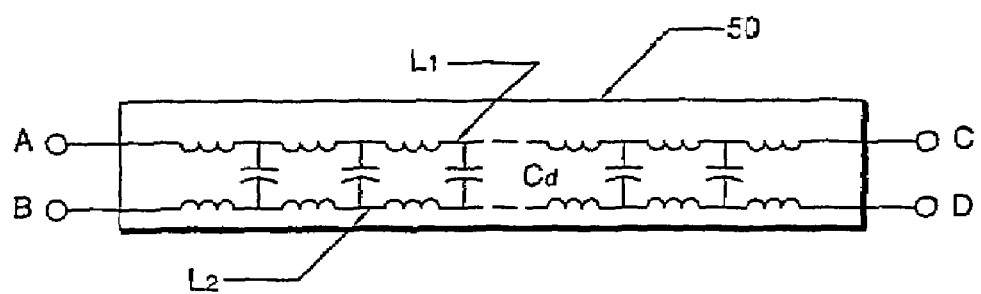
FIG. 2d is the equivalent circuit of the transmission line of FIGS. 2a–c

FIG. 2c shows yet another realization of the surface coil of FIGS. 2a and 2b in the form of twisted pair conductors. The distinction among the three pictured representations is simply the character of the transmission line: coaxial conductor, stripline and twisted pair. Other transmission line possibilities are feasible for practice of the invention and are not excluded. FIGS. 2a–c are different implementations of the same embodiment of the invention. Accordingly, FIG. 2d is the functional expression of an equivalent circuit applicable to FIGS. 2a–c. FIG. 2d exemplifies the ladder circuit model for a transmission line and hereafter the transmission line will be shown as a simple four terminal device. As keyed to FIG. 2a, one sees that each conductor of the transmission line 50 exhibits an inductance $L_1$ and $L_2$ (which need not be equal in the general case) respectively and these are capacitively coupled through a (total) distributed capacitance $c_d$. As here employed, each conductor is delimited by an active terminal and a floating terminal. The driven, or active ends each comprise one terminal of the corresponding conductor and the corresponding floating end remains an (inactive) terminal, thus defining the transmission line as a four terminal device. In typical practice, a variable capacitor is connected across the active terminals as a vernier, $c_t$, to adjust the resonance characteristics of the circuit, and another capacitance $c_m$ is connected in series with the RF device (source or receiver) to match the impedance of the RF device to the resonant circuit. The matching and tuning means associated with each embodiment of the invention is well known and may take many forms, such as capacitor networks, LC networks (for relatively low frequencies) and quarter wave transmission lines. These perform the well known functions of matching the impedance of the RF source/receiver to the impedance presented by the resonant circuit and separately, adjusting the resonant response of the tuned circuit. For the embodiments represented by the simple transmission line loop and characterized by a total distributed capacitance $c_d$, the external tune and match network may be adjustable over a relatively broad range.

It is worth noting that the representative forms of transmission line are characterized by the electrical and/or geometric symmetry of the conductors. The coaxial conductor example is unique for its intrinsic asymmetry, in that striplines, twisted pair, twin lead and the like are capable of an exact geometric and electrical symmetry. The inherent asymmetry of the coaxial geometry brings with it complete confinement (shielding) of the electric field for the co-axial case. The two conductors may also be characterized by (asymmetric) unequal current densities and inductances. While twisted pair, twin-lead, stripline and the like are capable of fully symmetric construction, there are advantages, which may be realized with deliberate asymmetric design. For another example, consider a stripline arranged in the form of aligned parallel conductor pairs, displaced along the normal to the surface to be studied. It is desirable for that conductor proximate the surface (of the object under study) to exhibit a width somewhat greater than the width of the distal conductor. This geometric and electrical asymmetry has the effect of directing the fringing electric field between the two conductors away from the surface of the object, thus limiting electric field losses in the object studied. Other utility for electrical asymmetry is discussed below, for the case of multiple resonant coils.

The different forms of transmission line allow different ranges of adjustable parameters for the desired tuned circuit. For example, a stripline is characterized by dielectric constant and dielectric thickness as well as conductor dimensions to contribute selected values of distributed capacitance and inductance. A coaxial conductor offers similar choices with the additional benefit of complete exclusion/containment of the electric field. A tune and match network is understood to be employed in any such RF resonant load and the character of the network for this function is well known to one of skill in the art. Such networks may be realized from various lumped constituents or from conventional transmission line stubs as may be appropriate to the frequency, power and other requirements. Any specific arrangements for the tune and match function shown herein are no more than simply representative.

Figure 3A:
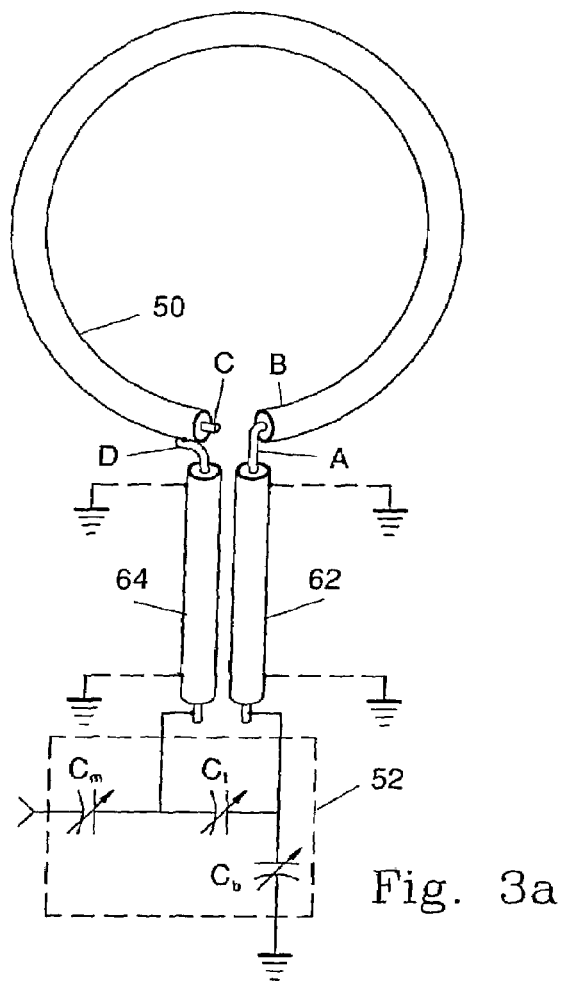
FIG. 3a is a shielded co-axial conductor surface coil.

FIG. 3a is an example of a shielded coaxial surface coil wherein independent shielded cables provide shielded access to the active common mode terminals A and D of the transmission line 50 forming the loop portion of the coil through shielded conductors 62 and 64. Note that the loop current is balanced with respect to ground: the inner stem conductors carry equal magnitude and oppositely directed currents. The shielded conductors are characterized by unipotential (grounded) shields and thus exhibit RF properties distinct from transmission line 50. As a practical matter, the shielded conductors 62 and 64 are components of the tune and match network 52.

Figure 3B:
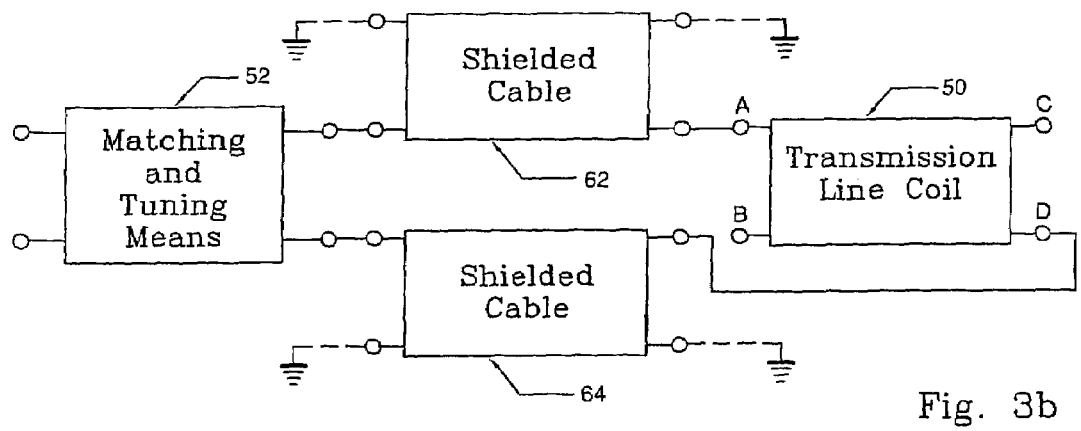

FIG. 3b is the analytic equivalent for the shielded transmission line surface coil of FIG. 3a. The loop portion of the coil comprises transmission line 50 and is identifiable with the embodiment of FIGS. 2a–d. For the shielded embodiment of FIG. 3a, the active common mode terminals A and D each communicate with the external RF apparatus through the shielded conductors 62 and 64 which may each be recognized as a 3 terminal device in contrast to the 4 terminal transmission line 50.

Figure 3C:
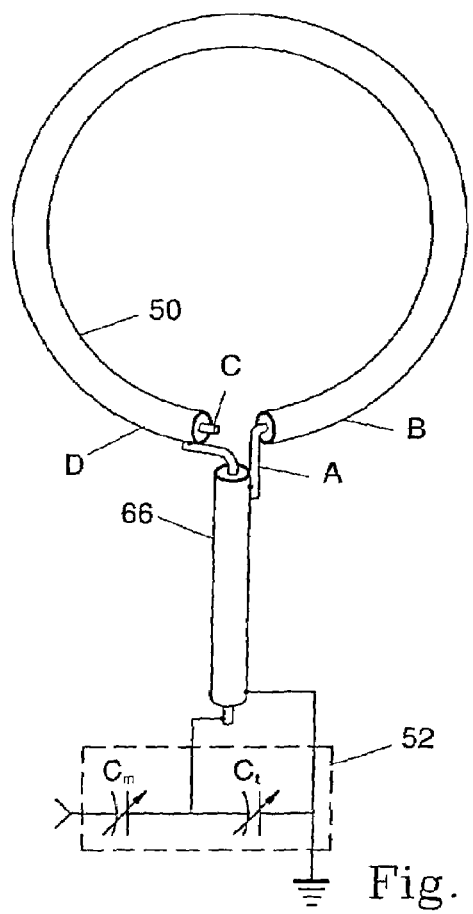
FIG. 3c is an unshielded co-axial conductor surface coil.
Figure 3D:
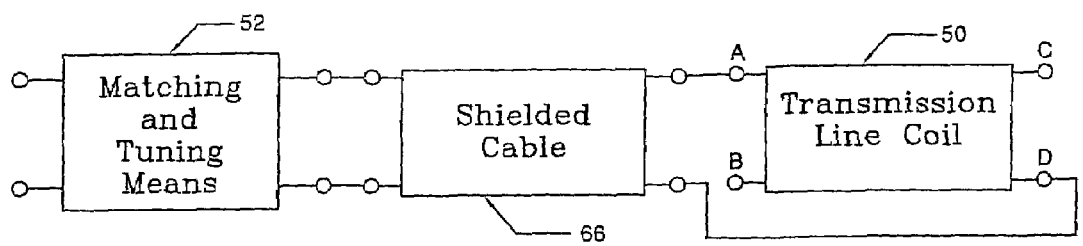
FIG. 3d is the functional analytic circuit for the surface coil of FIG. 3c.

FIG. 3c presents a variation of FIG. 3a wherein the leads are now represented by a single coaxial conductor. This embodiment is unshielded because the outer shielded conductor 66 is an active member of the circuit and the circuit performance will depend upon the relationship of the shield conductor 66 to ground.

As a practical matter, the localized performance of the surface coil favors minimal or null response to those regions of the body examined which lay outside of the immediate surrounds defined by the loop portion of the surface coil. Such coils communicate with the instrument through elongate conductors ("leads" portion) and it is preferable that the leads portion of the coil, as distinguished from the loop portion, should not effectively couple to the nuclear spins of the object studied. In the simple geometry shown, it may be noted that the radiation pattern of the loop portion of the resonant coils of FIGS. 2a–c might be expected to be disturbed by the linear extension of the transmission line 50 describing leads for physical extension of the "loop" portion. As is well understood, the RF field in the neighborhood of the leads is substantially canceled by the proximity of equal and oppositely directed currents in the two leads. Measurements for both balanced and unbalanced coaxial conductor embodiments were conducted with an RF pick-up loop close to the outer periphery of the loop over the angular extent of the loop and proximate the lead portion. For the balanced embodiment (FIG. 3a), variation of response was in the order of about −9 db to −11 db with about −34 db observed along the leads. The unbalanced coaxial embodiment (FIG. 3b) yielded similar results.

Figure 4A:
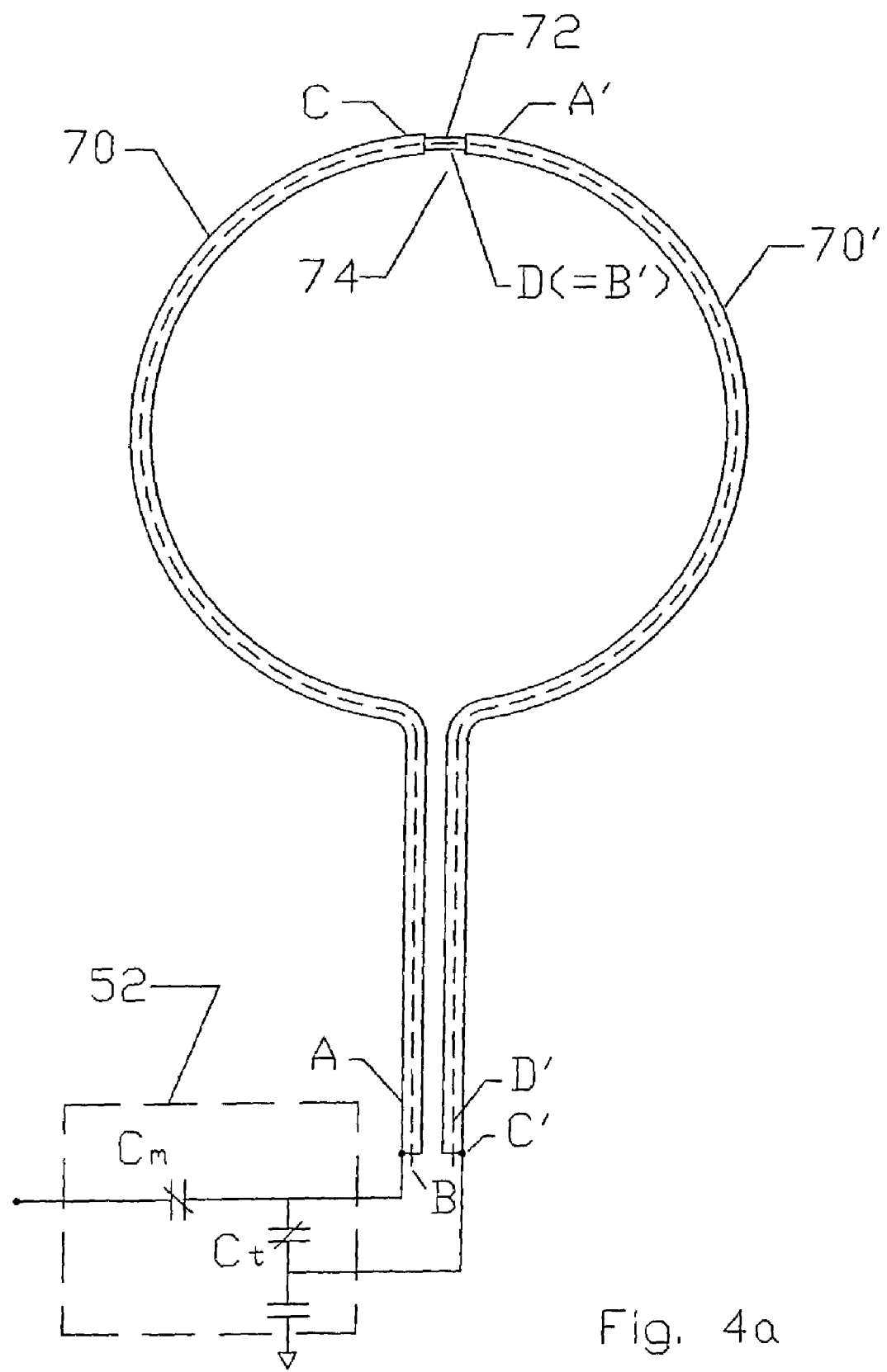
FIG. 4a is a surface coil formed of two transmission lines.
Figure 4B:
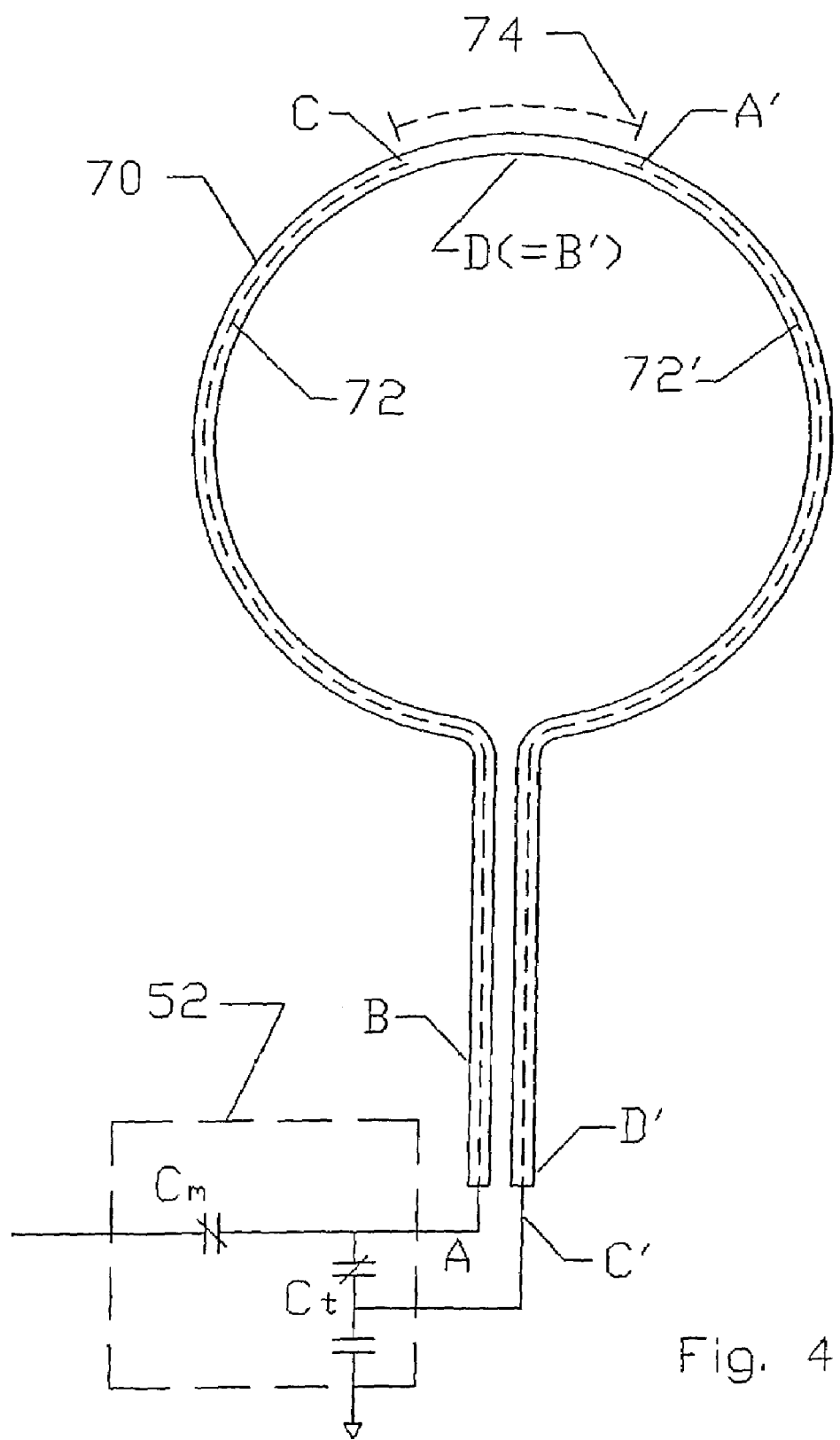
Figure 4C:
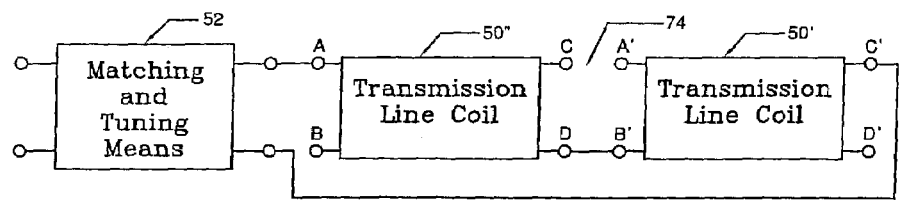
FIG. 4c is a functional analytic circuit for the surface coil of FIGS. 4a and 4c.
Figure 4D:
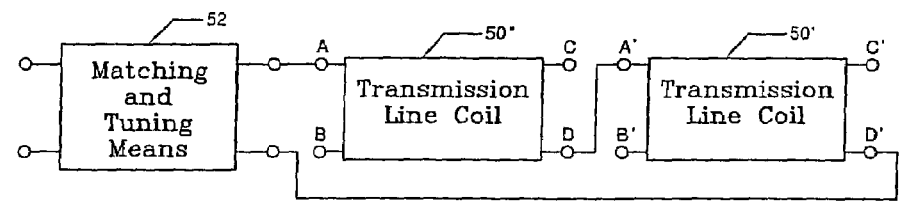
FIG. 4d is an alternate to FIG. 4c.

FIGS. 4a and 4b represent a composite transmission line formed by introducing a gap 74 in the transmission line (here, outer coaxial conductor 70-70' of FIG. 4a) or the inner coaxial conductor 72–72' (FIG. 4b). Stripline and twisted pair variations correspond to introduction of the equivalent gap in the one conductor or the other of that particular type transmission line. The analytic circuit representation of this embodiment is shown in FIG. 4c where the gap 74 simply introduces an interruption in one directly coupled inductor (now A-C') to produce two proximate floating terminals (C-A'). It is useful to recognize the functional result of such a gap as forming the interface between two communicating transmission lines 50' and 50"). It is worth noting that the interface between the two transmission lines is bridged either by the connection D-B' (FIG. 4c) or D-A' (FIG. 4d). These two examples are electrically identical in an exact sense for exactly symmetric conductors. In the case of coaxial conductors, the intrinsic departure from symmetry is small for most practical applications.

The gap introduced in one conductor of either of the FIG. 4a or FIG. 4b embodiments separates the that conductor into two inductances (conductors 70 and 70' for example) of respective LC transmission line circuits 50', 50". However, the two circuits are now present a combination with the gross result of what may be characterized as a lowered inductance for substantially the same distributed capacitance and therefore capable of resonant behavior at a higher frequency than the corresponding single common mode transmission line.

Figure 4E:
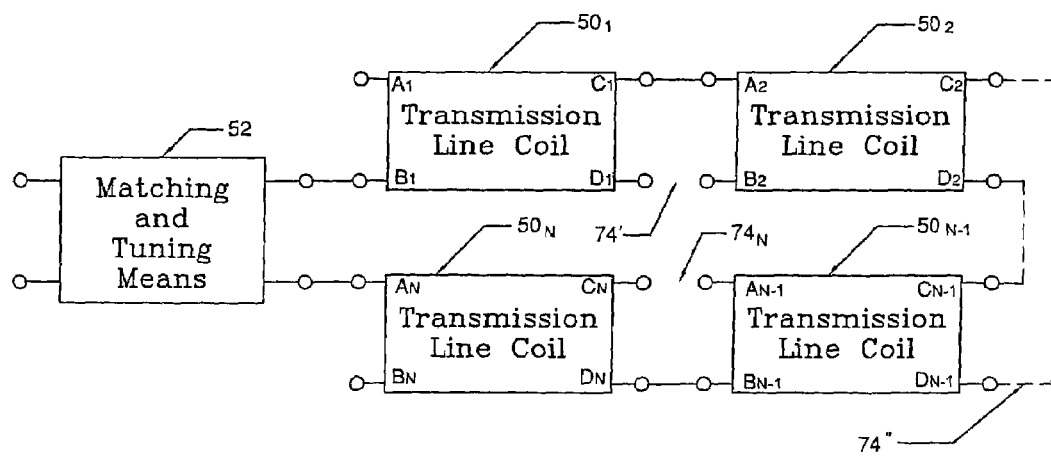
FIG. 4e shows a serial arrangement of common mode transmission line segments.

The introduction of a single gap in one conductor of the transmission line may be generalized to multiple gaps in one or both conductors. FIG. 4e illustrates in functionally analytic form, a transmission line wherein a plurality of gaps 74', 74", 74$_N$ are introduced in each inductive member of a transmission line and the gaps of one such inductive member are displaced relative to the gaps of the other inductive member. A non-conducting gap is small in relation to the axial length of the individual units of conductor contributing the segmented inductances of one conductor x as $L_{x1}$, $L_{x2}$, . . . $L_{xN-1}$, $L_{xN}$ and the gaps alternate between the conductor A-C and the conductor B-D. The gap separated inductive members comprising one (segmented) conductor are preferably staggered in relation to the gap separated inductive members of the other (segmented) conductor. An inductive member of one such set may be regarded as coupled through a portion of distributed capacitance to two gap separated inductive members of the opposite inductive member set. The two common mode RF paths thus alternate between the several gaps. In a very qualitative sense, this essentially associates adjacent inductive members in parallel with significant reduction of the effective inductance. The analytic treatment of such networks is outside the scope of the present work, but the practical summary is apparent in noting that multiple gaps in simple transmission lines have the effect of reduction of effective inductance, leading to more easily achieved tuned circuits at higher frequencies following the inventive principle.

Figure 5A:
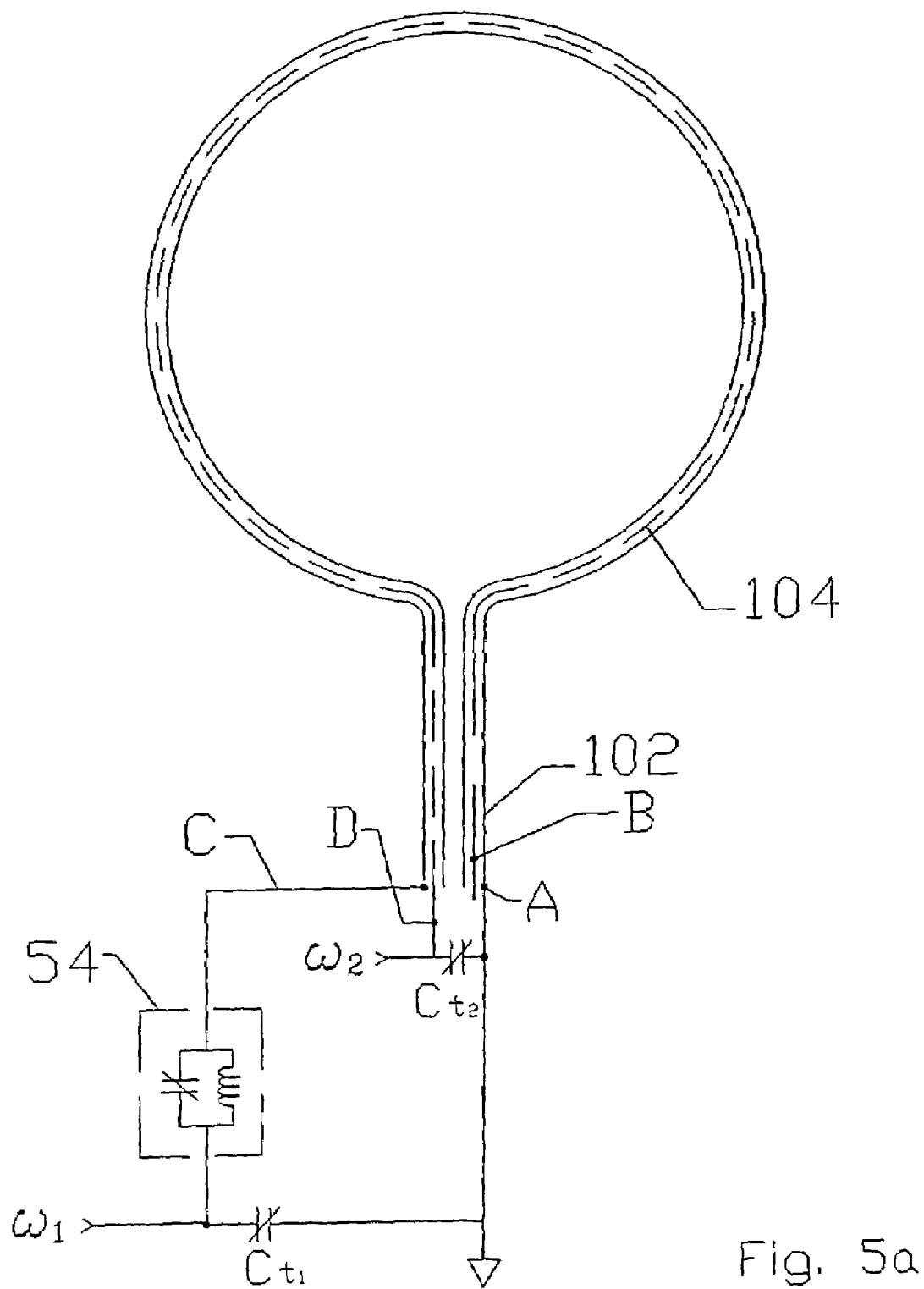
FIG. 5a is a double tuned surface coil implemented from coaxial conductors.
Figure 5B:
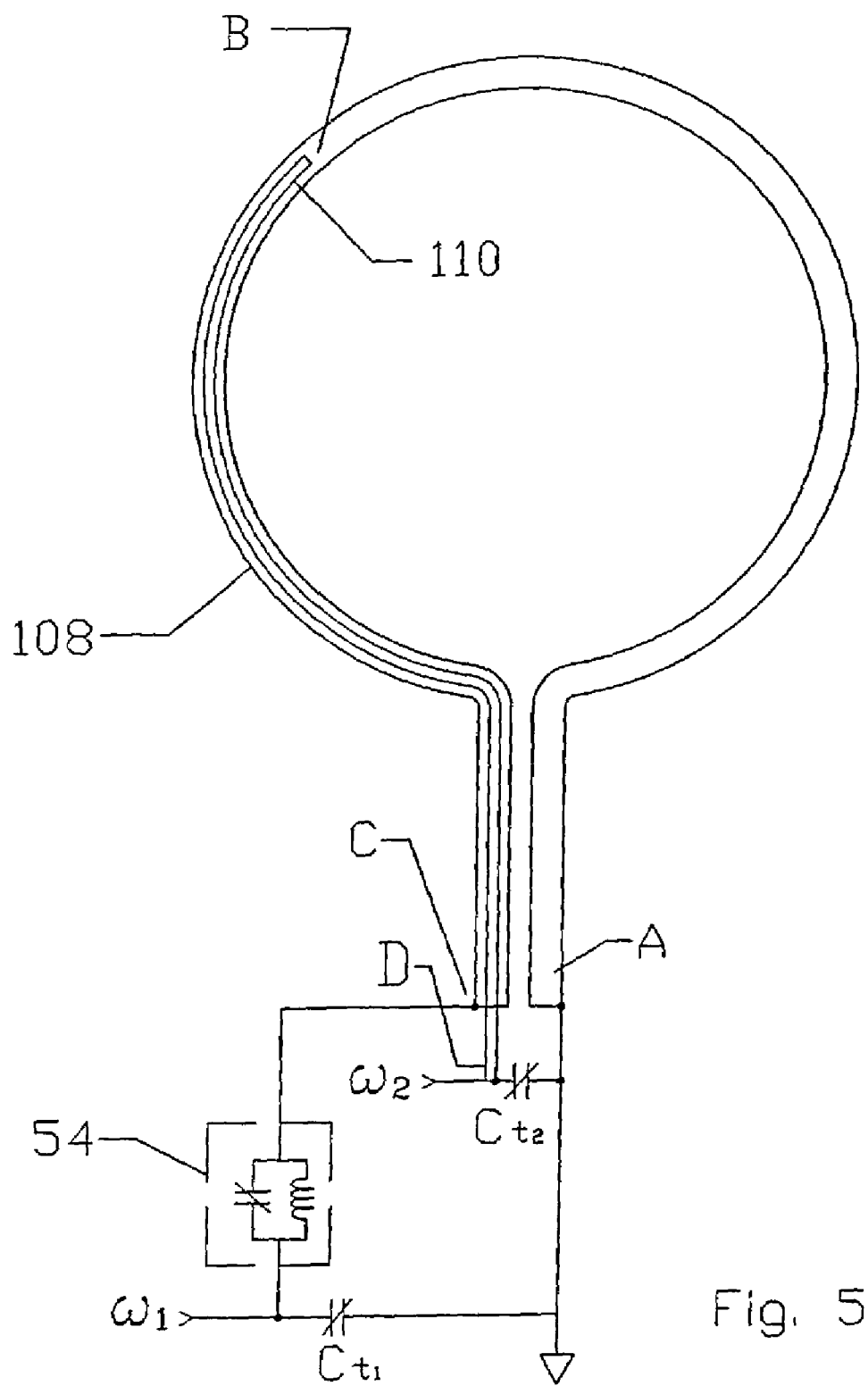
FIG. 5b is a double tuned surface coil implemented from stripline.
Figure 5C:
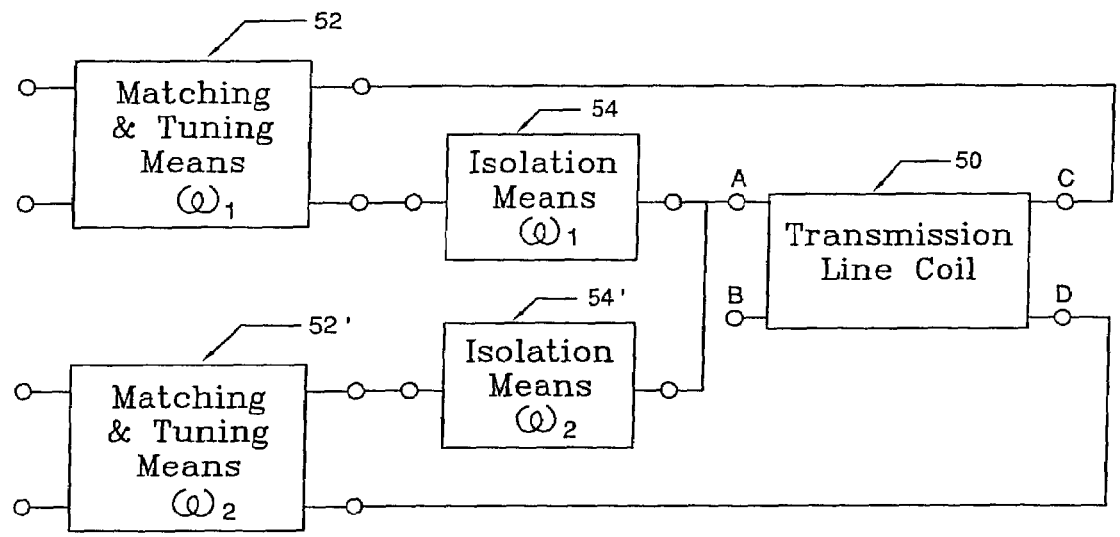
FIG. 5c is a functional analytic circuit for an alternate double tuned arrangement.

The electrical topology of the four terminal device may be adapted to support a multiply resonant tuned circuit. As many as four resonant frequencies may be supported as described below. First consider the double tuned arrangement, shown at FIG. 5a where a coaxial transmission line is adapted to support a double resonant embodiment. In general, a transmission line comprises inductor 102 having active direct coupled terminals A and C forming one RF path for frequency $\omega_1$ incorporating the relatively higher inductance A-C segment. Inductor 104 includes active terminal D and floating terminal B. Another RF path, resonant at $\omega_2$ can be defined through common mode path A-D. Thus, a lower frequency $\omega_1$ and relatively higher frequency $\omega_2$ are accommodated. Frequency isolation filter 54 and/or 54' is provided in one or both loops as shown here in the form of a simple filter of low pass, high pass, or band pass properties, as may be desired. Tuning capacitors for each circuit are provided to more precisely adjust the corresponding resonant behavior. FIG. 5b shows a similar arrangement for a formed from facing conductors 108–110 where one strip conductor 110 is of a selected length to yield the designed integral of distributed capacitance. A twisted pair arrangement for achieving the double resonant properties of FIGS. 5a, b is similarly obtained. FIG. 5c is the analytic model for the physical embodiments of FIGS. 5a, b. Note that in this model, there are two RF loops realized through the transmission line 50: one incorporating the direct coupled (A-C) RF path and one incorporating the common mode (A-D) RF path.

Figure 5D:
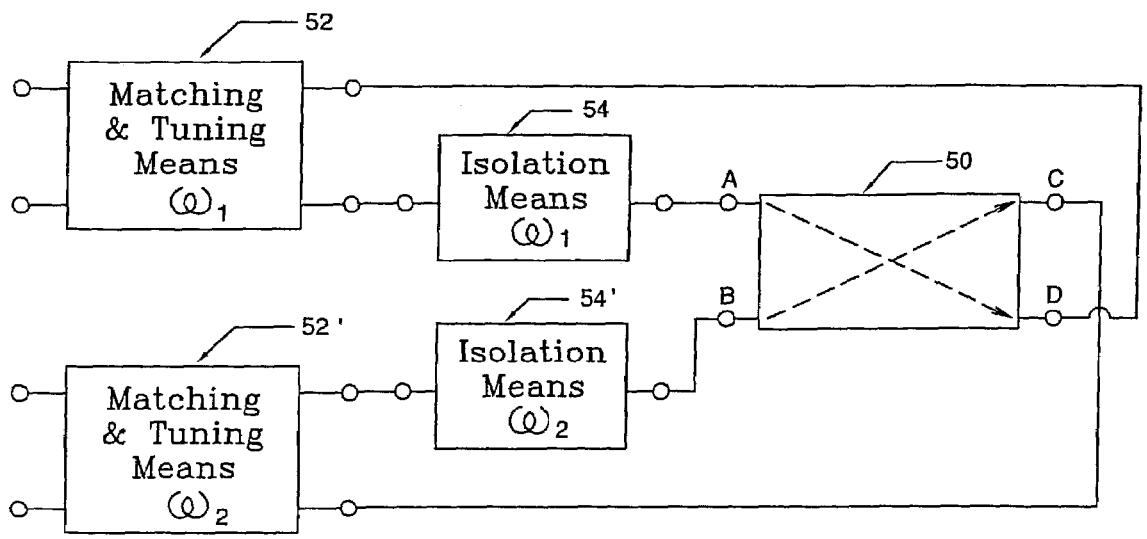
FIG. 5d is a functional analytic representation for dual common mode frequency paths.
Figure 5E:
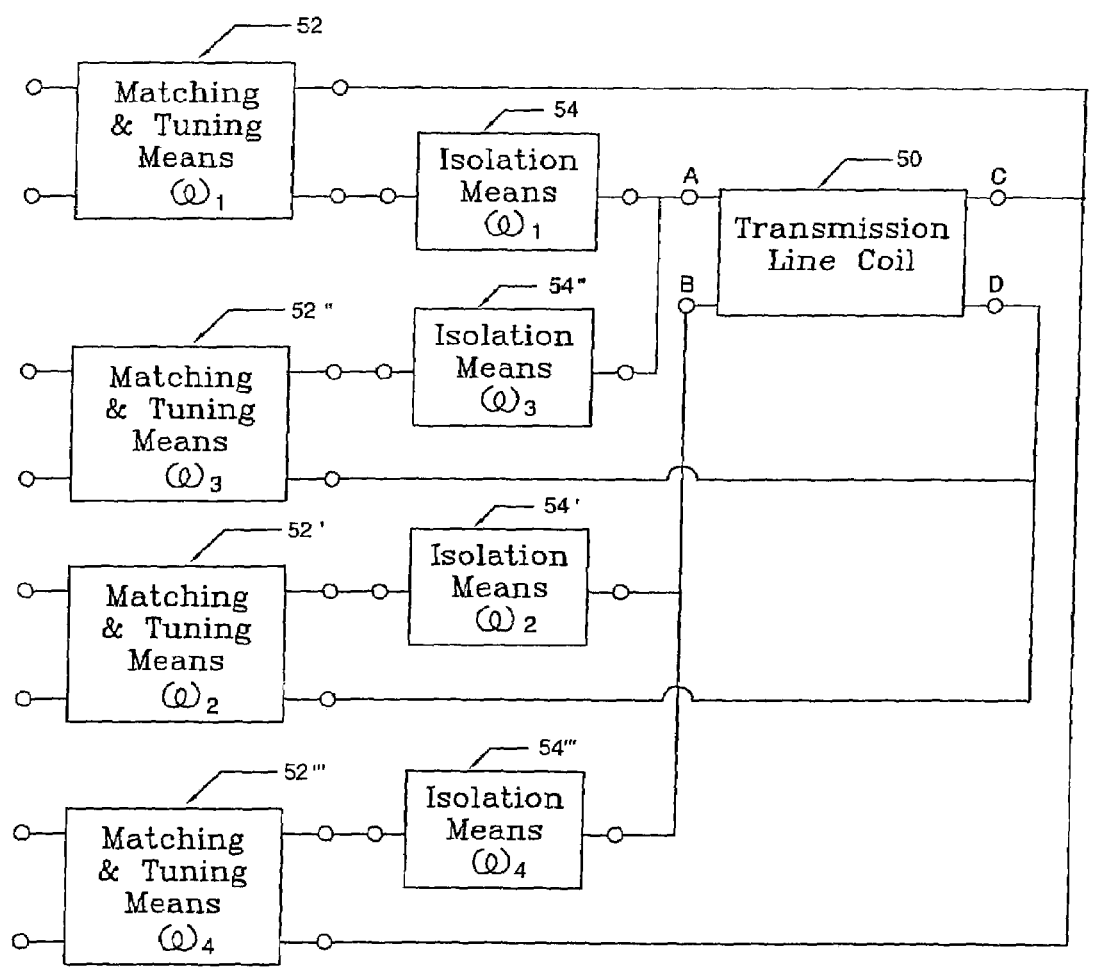
FIG. 5e is a functional analytic circuit for a quad-resonant arrangement.

FIG. 5d illustrates a double tuned circuit realized from separate common mode RF paths, e.g., A-D and B-C, to serve corresponding separate resonant RF current loops. In such usage, the completely symmetrical transmission line affords quite strong coupling for two channels sharing the common mode RF path.

It should be apparent that just as both common mode possibilities can support separate resonances in respective circuit loops, so also, the two direct coupled paths A-C and B-D may each be incorporated within respective circuit loops. Thus a quad-resonant coil is easily realized combing both direct coupled and both common mode segments. Each loop is understood to incorporate respective tune and match networks and preferably corresponding frequency isolation filters.

Multiply resonant applications exhibit improved performance for inclusion in respective loops of appropriate frequency isolation, as for example frequency isolation sub-networks or filters 54, 54', etc. Such filter may take the form of high pass, low pass or band pass filter as the case may be and the general nature of these arrangements are well known to one of skill in the art.

Figure 6A:
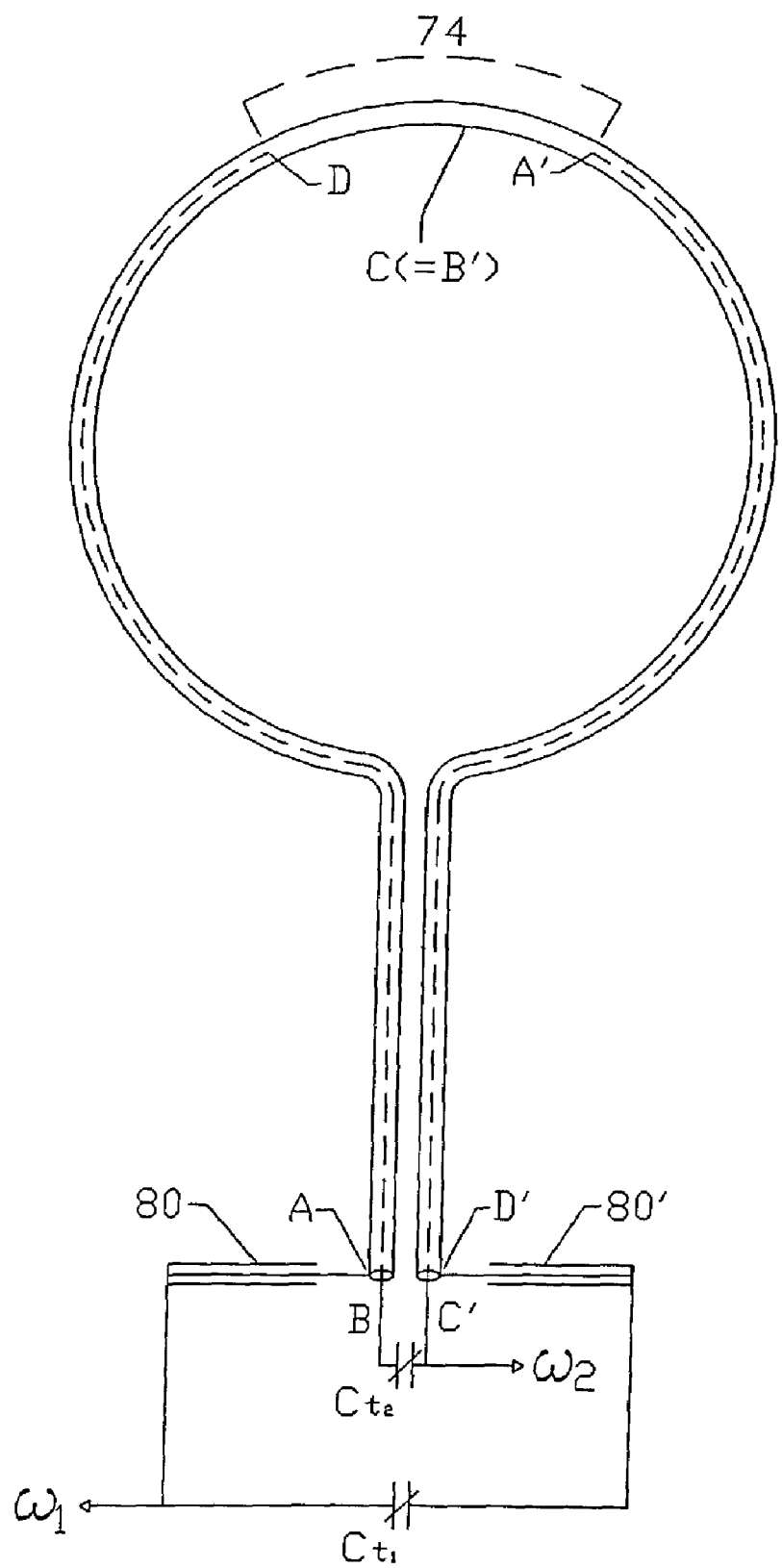
FIG. 6a is a double tuned surface coil of the invention using two common mode transmission lines.
Figure 6B:
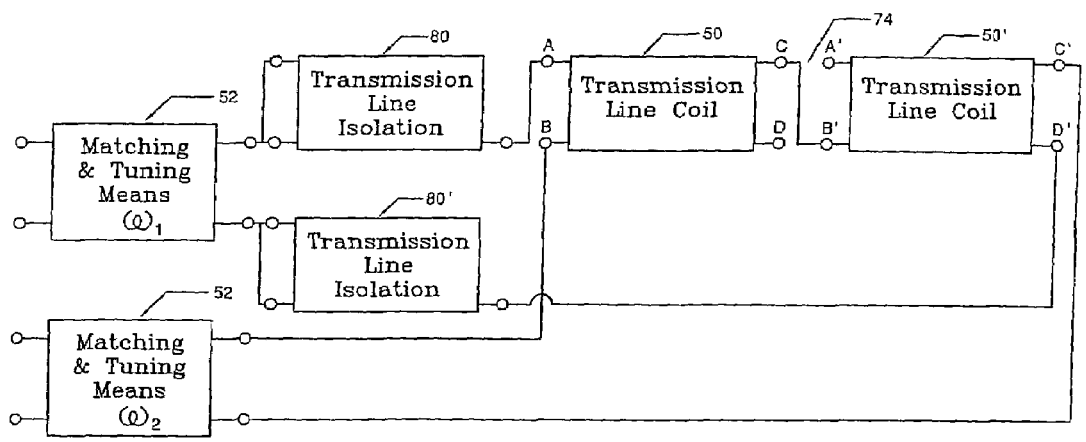
Figure 6C:
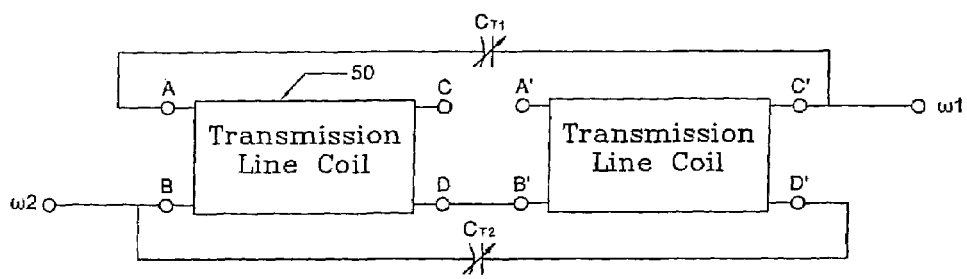

Another embodiment is shown in physical form in FIG. 6*a* and in functional analytic form in FIG. 6*b*. Part of the frequency isolation function is represented by quarter wave (conventional) transmission line stubs 80 and 80' in the respective frequency channels. The lower frequency (higher inductive) path is evident in the direct coupled loop including A-(C=B')-D' where it is understood that the gap 74 creates a pair of serially communicating transmission lines as described previously and here, C and B' are effectively the identical point. The higher frequency is supported through the resonant properties of the loop including the serially communicating common mode path B-(C=B')-C'.

Figure 7A:
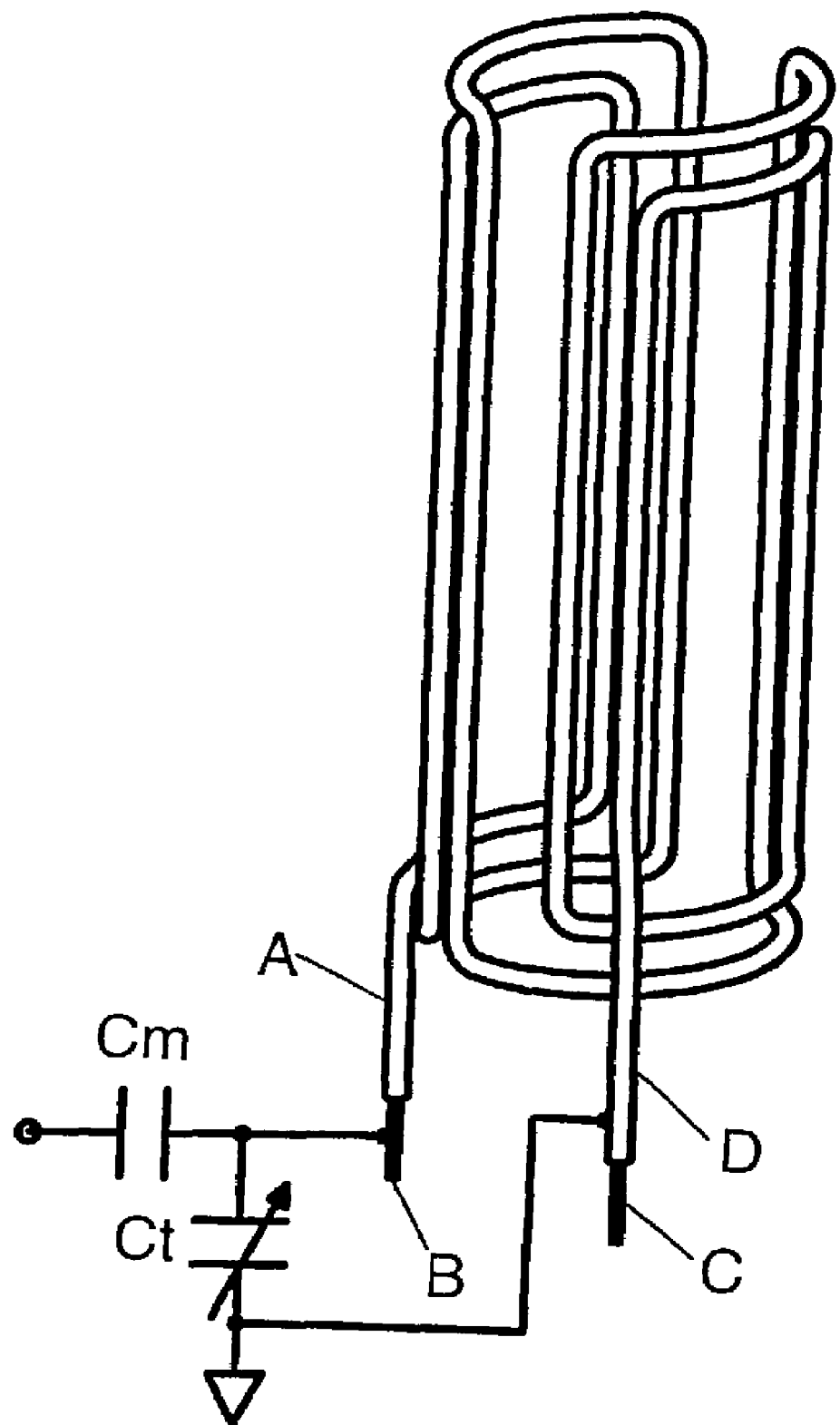
FIG. 7a is a volume coil of the saddle geometry using the invention.
Figure 7B:
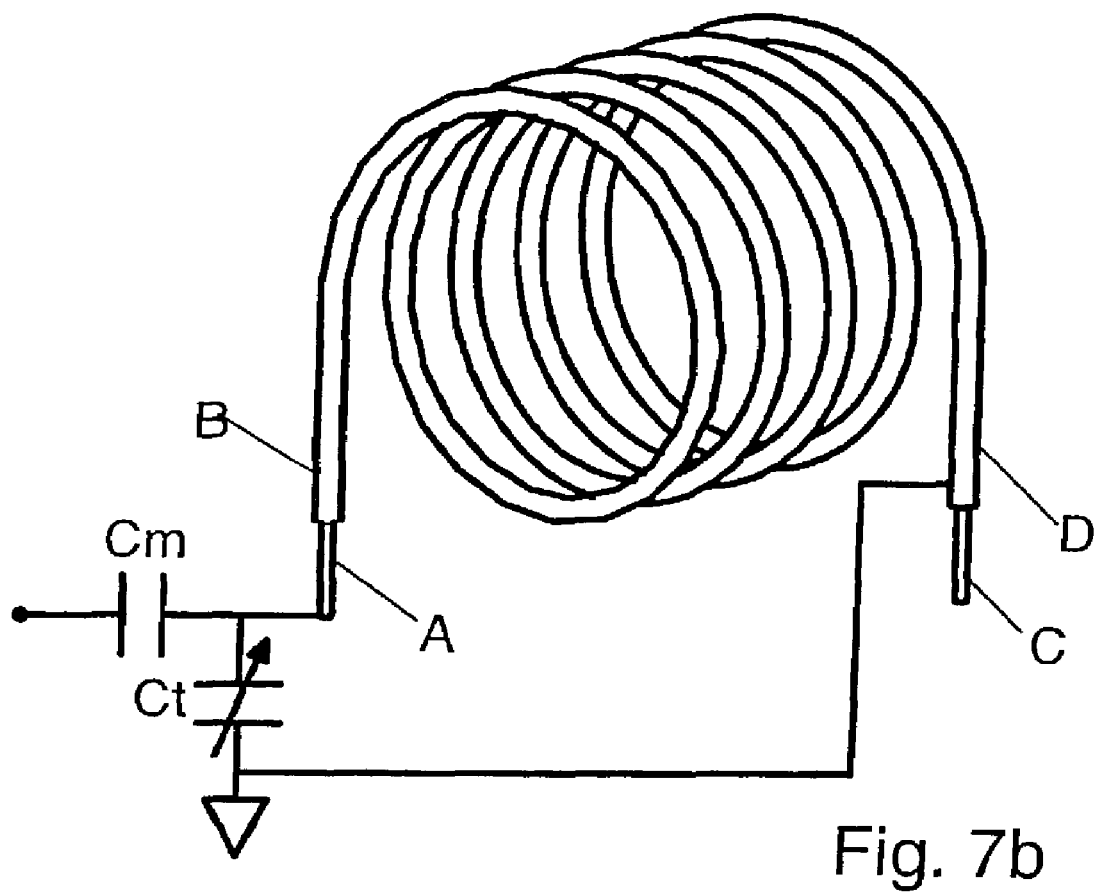
FIG. 7b is a volume coil of solenoidal geometry using the invention.

It should be recognized that the utility of the common mode transmission line of the present invention may be utilized for other resonant circuit applications. Particularly in the field of NMR, volume coil structures may also utilize the principles here described. These are also useful for analytic NMR studies. Consider the saddle coil of FIG. 7*a* and the solenoid coil of FIG. 7*b*. These structures are similar in form to prior art, effectuated in accord with the present invention. Although illustrated in complete analogy with the surface coil of FIG. 2*a*, embodiments shown in FIGS. 2–6 inclusive are applicable to volume coils. In prior art there is known a lumped element serial resonant volume coil featuring a number of twisted pair conductors to supply capacitance in series between solenoidal coil loops. (Cook and Lowe, J. Mag. Res., v. 49, pp. 346–349; 1982.). Although such structures may supply similar functional performance, it is readily apparent that present utilization of the common mode transmission line structure offers unusually numerous advantages. Exclusion of E-field losses is realized through the entire or partial shielding of the transmission line. Manufacturing ease and consistency between individual coils is greatly improved because of the independent close tolerances of the transmission line. Discontinuities required by conventional use of chip capacitors are avoided and RF homogeneity is improved. Susceptibility compensation is easily achieved in the aggregation of mechanical components of separately tailored susceptibility values in a generally symmetric whole. Moreover less $B_0$ distortion is a consequence of the simple and generally symmetric mechanical structures forming the NMR coils of the invention.

A comparison of the embodiment of FIG. 2*a* with a standard wire surface coil provides an illustration of the improved performance obtained with the invention. A standard wire surface coil of substantially identical geometry (2 cm diameter) to a surface coil of the invention. Both surface coils were tuned and matched for resonance at 400 MHz and were bench tested without sample loading and respective Q values were measured. The inventive surface coil exhibited a Q value of 178 compared to the standard surface coil measured Q value of 60. The present invention demonstrates a significant advantage over the prior art is sensitivity and signal-to-noise ratio.

In several of the foregoing figures the inductive component conductors of the loop portion of the transmission line are shown in a symmetrical or asymmetrical disposition. No constraint on the geometric design of the surface coil is intended. The designer is concerned with both RF and geometric properties of the surface coil and these may be independent and/or susceptible to compromise. The radiation pattern associated with the surface coil as an antenna is, of course, effected by the geometric configuration. One of skill in the art may reconcile the transmission line parameters, resonant frequency, and radiation pattern for the purposes of the particular application within the scope of the invention.

What is claimed is:

1. A multiply tuned coil for NMR investigations comprising:
    a 4 terminal transmission line, said transmission line comprising at least two electrical conductors in spaced relationship and a dielectric disposed therebetween, a first active terminal of said 4 terminal transmission line being direct coupled through one said conductor to a common active terminal to comprise a first RF path, a second pair of terminals of said 4 terminal transmission line comprising a third active terminal directly coupled to a floating terminal, said third active terminal being capacitively coupled between said electrical conductors to form a second RF path,
    a first resonant circuit comprising said first RF path,
    a second resonant circuit comprising said second RF path, and
    a frequency isolating network disposed in at least one said resonant circuit.

2. A multiply tuned coil for NMR investigations comprising:
    a 4 terminal transmission line, said transmission line comprising at least first and second electrical conductors in spaced relationship and a dielectric disposed therebetween, a first pair of terminals of said 4 terminal transmission line being capacitvely coupled between said electrical conductors to comprise a first RF path, a second pair of terminals of said 4 terminal transmission line being capacitively coupled between said electrical conductors to form a second RF path, said second pair of terminals distinct from said first pair of terminals,
    a first resonant circuit comprising said first RF path,
    a second resonant circuit comprising said second RF path, and
    at least one frequency isolating network for providing RF isolation between said first and second RF paths.

3. The multiply tuned coil of claim 2, further comprising a third RF path, said third path comprising said first electrical conductor whereby a third resonant circuit is realized.

4. The multiply tuned coil of claim 3, further comprising a fourth RF path, said fourth path comprising said second electrical conductor whereby four resonant circuits are supported by said 4 terminal transmission line.

5. The multiply tuned coil of claim 2, wherein said coil is a surface coil.

* * * * *